United States Patent
Dong

(10) Patent No.: US 7,268,064 B2
(45) Date of Patent: Sep. 11, 2007

(54) METHOD OF FORMING POLYSILICON LAYER IN SEMICONDUCTOR DEVICE

(75) Inventor: Cha Deok Dong, Kyungki-Do (KR)

(73) Assignee: Hynix Semiconductor Inc., Kyungki-Do (KR)

(*) Notice: Subject to any disclaimer, the term of this patent is extended or adjusted under 35 U.S.C. 154(b) by 0 days.

(21) Appl. No.: 11/016,413

(22) Filed: Dec. 17, 2004

(65) Prior Publication Data
US 2005/0287822 A1 Dec. 29, 2005

(30) Foreign Application Priority Data
Jun. 29, 2004 (KR) .................. 10-2004-0049763

(51) Int. Cl.
*H01L 21/336* (2006.01)
(52) U.S. Cl. .............. 438/488; 438/257; 257/E29.129; 257/E21.623; 257/E21.635; 257/E21.179
(58) Field of Classification Search ............... 438/488, 438/FOR. 393, 257; 257/E29.129, E21.623, 257/E21.635, E21.179
See application file for complete search history.

(56) References Cited

U.S. PATENT DOCUMENTS

| 5,141,892 | A | * | 8/1992 | Beinglass | .................. 438/684 |
| 5,591,664 | A | * | 1/1997 | Wang et al. | ................. 438/254 |
| 6,479,166 | B1 | * | 11/2002 | Heuer et al. | ................. 428/620 |
| 2003/0102503 | A1 | * | 6/2003 | Rabkin et al. | .............. 257/315 |

FOREIGN PATENT DOCUMENTS

| CN | 1404113 A | 10/2002 |
| KR | 1997-0052007 | 7/1997 |
| KR | 0118876 | 7/1997 |

* cited by examiner

*Primary Examiner*—George Fourson
(74) *Attorney, Agent, or Firm*—Marshall, Gerstein & Borun LLP

(57) ABSTRACT

Disclosed herein is a method of forming a polysilicon film of a semiconductor device. Upon deposition process of a polysilicon film, the inflow of a gas is reduced to 150 sccm to 250 sccm to control abnormal deposition depending upon excessive inflow of the gas. Accordingly, the interfacial properties of the polysilicon film can be improved. It is thus possible to improve an operating characteristic of a device by prohibiting concentration of an electric field at the portion.

2 Claims, 5 Drawing Sheets

METHOD OF FORMING POLYSILICON LAYER IN SEMICONDUCTOR DEVICE

BACKGROUND OF THE DISCLOSURE

Field of the Disclosure

The disclosure generally relates to a method of forming a polysilicon film of a semiconductor device, and more specifically, to a method of forming a polysilicon film of a semiconductor device in which the interfacial properties of the polysilicon film can be improved.

BRIEF DESCRIPTION OF RELATED TECHNOLOGY

In semiconductor devices, it is very important for a polysilicon film used as an electrode (a floating gate) to have smooth interface properties in a flash memory device. If the interfacial properties of the polysilicon film are poor, concentration of an electric field is caused by a high voltage bias and an unnecessary dielectric film is formed accordingly. It is thus required that a polishing process such as a chemical mechanical polishing (CMP) process as a subsequent process be performed additionally.

If the CMP process is used, however, there are many difficulties such as cost increase and securing of process stability. Therefore, of all things, it is important to form a polysilicon film so that it has smooth interfacial properties starting from a process of depositing the polysilicon film. Further, in forming the polysilicon film conventionally, the deposition process is performed while flowing a very large amount of a gas in comparison with a tube volume. This is for increasing deposition stability and uniformity. Upon deposition of the polysilicon film, $SiH_4$ is flowed into a chamber at the rate of approximately 1000 sccm to 1500 sccm. This inflow is set considering deposition stability and uniformity. If the rate is lower than 1000 sccm to 1500 sccm, deposition stability and uniformity are degraded. If the rate is higher than 1000 sccm to 1500 sccm, particles are generated. In this inflow, a polysilicon film having rough interfacial properties is formed.

FIGS. 8 and 9 are TEM photographs showing profiles of polysilicon films when the polysilicon films are formed by a prior art method. FIGS. 10 and 11 are TEM photographs showing the roughness of polysilicon films at the bottom of a dielectric film in a flash memory device formed by the method of forming the polysilicon film of the semiconductor device. As shown in FIGS. 10 and 11, if the interfacial properties of the polysilicon film are poor, the dielectric film formed on the polysilicon film becomes irregular. Thus, the operating properties of the memory cell are degraded.

SUMMARY OF THE INVENTION

Disclosed herein is a method of forming a polysilicon film of a semiconductor device in which the interfacial properties of the polysilicon film can be improved. The method includes loading a semiconductor substrate into a deposition chamber and then flowing a $SiH_4$ or $Si_2H_6$ gas into the deposition chamber at a flow rate of approximately 150 sccm to 250 sccm, thus forming an undoped polysilicon film on the semiconductor substrate.

Further, according to another embodiment, the method includes, after loading a semiconductor substrate into a deposition chamber, flowing a $SiH_4$ or $Si_2H_6$ gas into the deposition chamber at a flow rate of approximately at least 1000 sccm and flowing a $PH_3$ gas into the deposition chamber to form a doped polysilicon film on the semiconductor substrate; and stopping the inflow of the $PH_3$ gas and reducing the inflow of the $SiH_4$ or $Si_2H_6$ gas to about 150 sccm to 250 sccm, thus forming an undoped polysilicon film on the doped polysilicon film.

Additional features of the disclosed method may become apparent to those skilled in the art from a review of the following detailed description, taken in conjunction with the drawing figures and the appended claims.

BRIEF DESCRIPTION OF THE DRAWINGS

For a more complete understanding of the disclosure, reference should be made to the following detailed description and accompanying drawings wherein.

Figure 1:
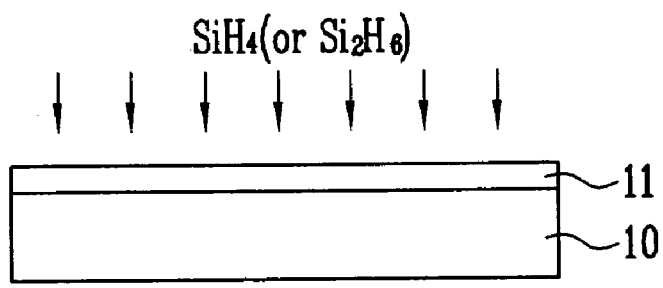
FIG. 1 is a cross-sectional view showing steps of a method of forming a polysilicon film of a semiconductor device according to a first embodiment of the present invention.

While the disclosed method is susceptible of embodiments in various forms, there are illustrated in the drawing (and will hereafter be described) specific embodiments of the method, with the understanding that the disclosure is intended to be illustrative, and is not intended to limit the claimed invention to the specific embodiments described and illustrated herein

DETAILED DESCRIPTION OF THE INVENTION

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

FIG. 1 is a cross-sectional view showing steps of a method of forming a polysilicon film of a semiconductor device according to a first embodiment of the present invention. Referring to FIG. 1, a semiconductor substrate 10 in which a predetermined semiconductor structure layer is formed is loaded into a low pressure chemical vapor deposition (LPCVD) chamber. A $SiH_4$ or $Si_2H_6$ gas is then reflowed into the chamber at the rate of about 150 sccm to 250 sccm to form an undoped polysilicon film 11 at a temperature ranging from 500° C. to 550° C. In this time, the semiconductor structure layer can be a gate dielectric film (or a tunnel oxide film). Further, the semiconductor structure layer may include elements that are typically used in a semiconductor device such as a flash memory device.

Figure 2:
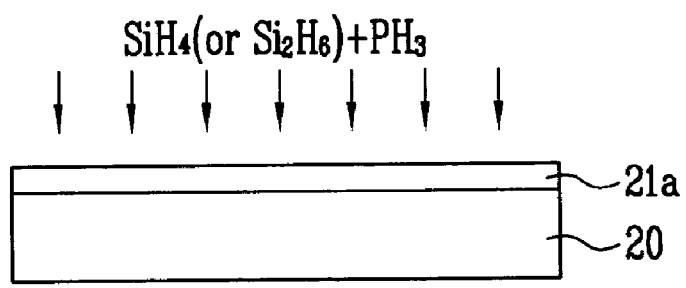
FIGS. 2 and 3 are cross-sectional views showing steps of a method of forming a polysilicon film of a semiconductor device according to a second embodiment of the present invention.
Figure 3:
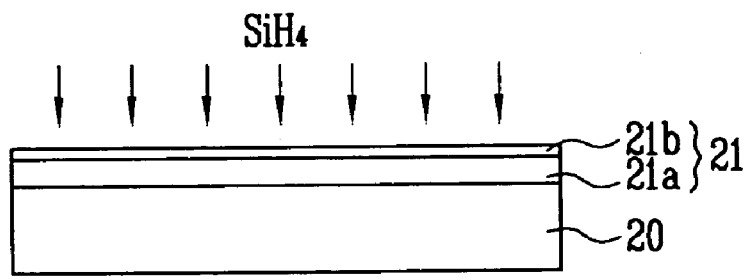

FIGS. 2 and 3 are cross-sectional views showing steps of a method of forming a polysilicon film of a semiconductor device according to a second embodiment of the present invention. Referring to FIG. 2, a semiconductor substrate 10 in which a predetermined semiconductor structure layer is formed is loaded into a LPCVD chamber. A $SiH_4$ or $Si_2H_6$ gas is then flowed into the chamber at the rate of at least 1000 sccm and a $PH_3$ gas is flowed into the chamber considering the doping concentration, thus forming a doped polysilicon film 21*a*. In this time, the semiconductor structure layer can be a gate dielectric film (or a tunnel oxide film). Further, the semiconductor structure layer may include elements that are typically used in a semiconductor device such as a flash memory device. Thereafter, after the reflow of the $PH_3$ gas into the chamber is stopped, the flow rate of the $SiH_4$ or $Si_2H_6$ gas is reduced to 150 sccm to 250 sccm, thereby completing the deposition process. An undoped polysilicon film 21*b* is thus deposited on the doped polysilicon film 21*a* to form a final polysilicon film 21.

Figure 4:
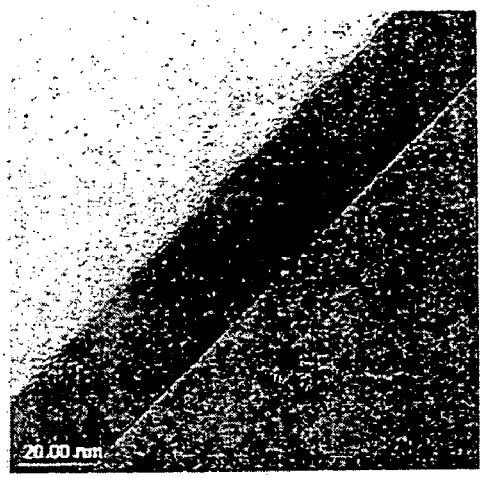
FIGS. 4 to 6 are TEM (Transmission Electron Microscope) photographs of the polysilicon films formed by the method of forming the polysilicon film of the semiconductor device according to the first and second embodiments of the present invention.
Figure 5:
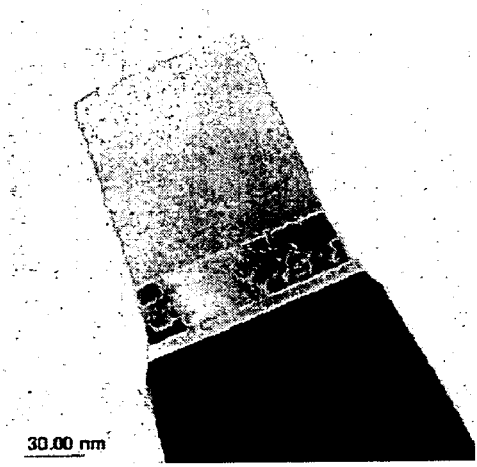
Figure 6:
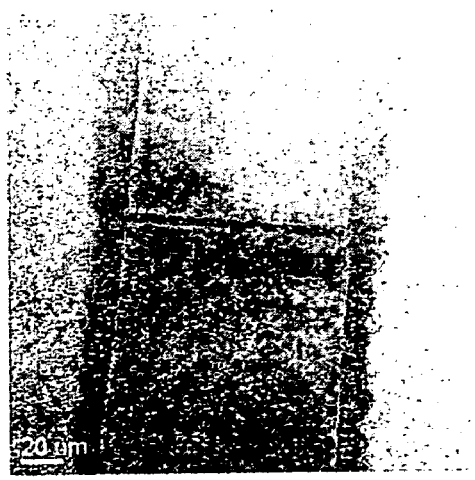
Figure 7A:
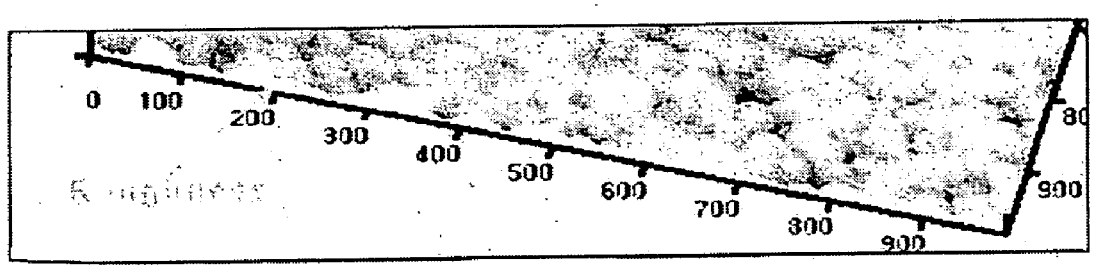
FIG. 7a shows APM for explaining the interfacial properties when a polysilicon film is deposited where the inflow of $SiH_4$ gas is set to 1000 sccm.
Figure 7B:
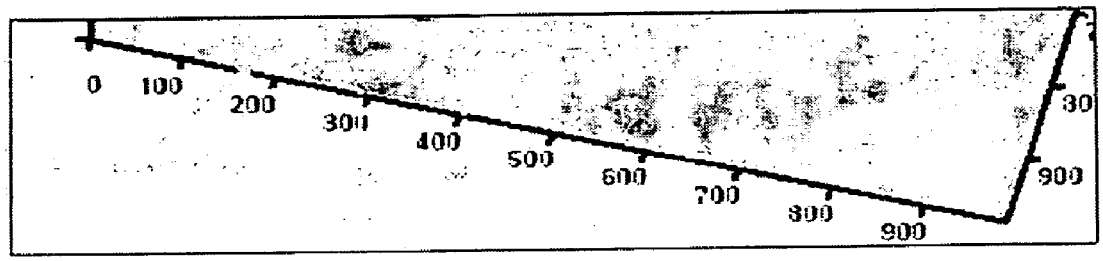
FIG. 7b shows APM for explaining the interfacial properties when a polysilicon film is deposited where the inflow of $SiH_4$ gas is set to 185 sccm.
Figure 8:
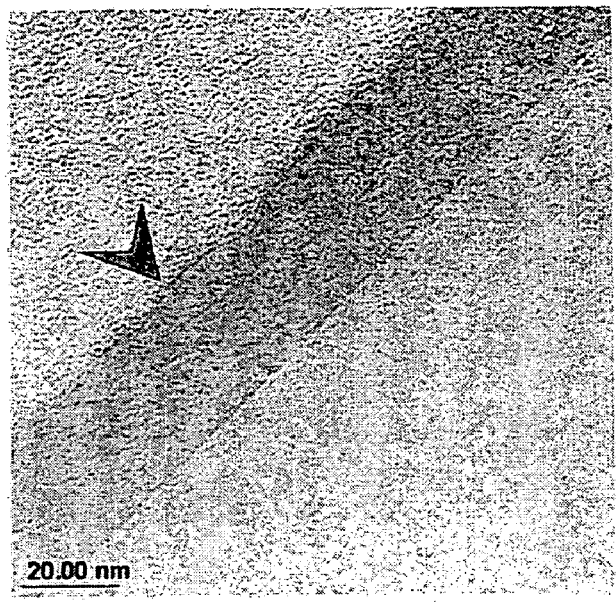
FIGS. 8 and 9 are TEM photographs of polysilicon films formed by a conventional method of forming a polysilicon film of a semiconductor device; and, FIGS. 10 and 11 are TEM photographs showing the roughness of a polysilicon film at the bottom of a dielectric film in a flash memory device formed by the method of forming the polysilicon film of the semiconductor device.
Figure 9:
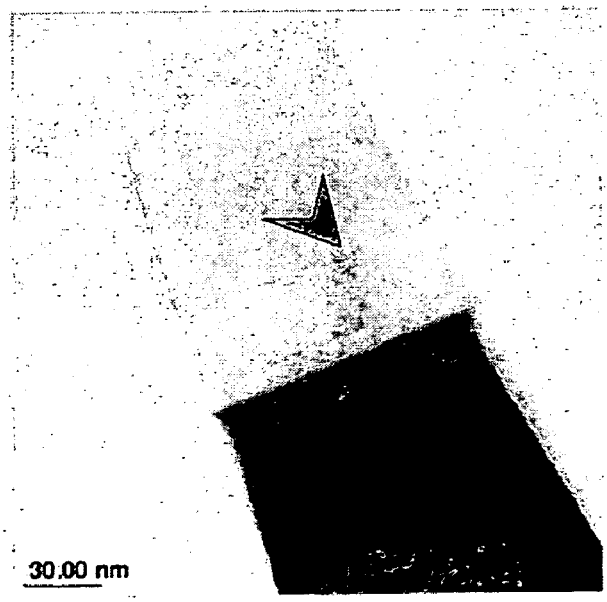
Figure 10:
Figure 11:
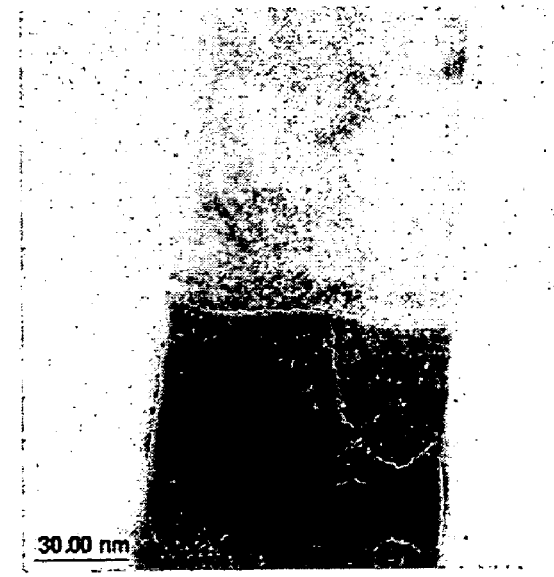

TEM photographs of the flash memory cells formed by the method of forming the polysilicon film of the semiconductor device according to the first and second embodiments of the present invention are shown in FIGS. 4 to 6. From FIGS. 4 to 6, it can be seen that the interfacial properties of the polysilicon film are improved. Meanwhile, FIG. 7*a* shows APM for explaining the interfacial properties when the polysilicon film is deposited where the inflow of $SiH_4$ gas is set to 1000 sccm. FIG. 7*b* shows APM for explaining the interfacial properties when a polysilicon film is deposited where the inflow of $SiH_4$ gas is set to 185 sccm. It can be seen that the interfacial properties of the polysilicon film shown in FIG. 7*b* is improved better than those shown in FIG. 7*a*.

As described above, according to the present invention, upon deposition process of forming a polysilicon film, abnormal deposition depending on the inflow of excessive gas is controlled by reducing the inflow of the gas to 150 sccm to 250 sccm. Therefore, the interfacial properties of the polysilicon film can be improved. Accordingly, the operation of the flash memory cell can be improved by prohibiting concentration of an electric field at this portion. Additionally, waste of the gas is prevented by controlling the flow of a gas to a small amount and cost is thus saved. Further, existing equipment and process can be used without the need for new and complex process and equipment. It is thus possible to form a device with low cost and high reliability.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming a polysilicon film of a semiconductor device, the method comprising,
   (a) loading a semiconductor substrate into a deposition chamber;
   (b) flowing a $SiH_4$ or $Si_2H_6$ gas into the deposition chamber at a flow rate of at least 1000 sccm and flowing a $PH_3$ gas into the deposition chamber to form a doped polysilicon film on the semiconductor substrate; and
   (c) stopping the inflow of the $PH_3$ gas and reducing the inflow of the $SiH_4$ or $Si_2H_6$ gas to 150 sccm to 250 sccm in order to form an undoped polysilicon film on the doped polysilicon film, while maintaining a temperature of the interior of the deposition chamber, in a range of 500° C. to 550° C. during steps (b) and (c).

2. The method of claim 1, wherein the deposition chamber is a LPCVD chamber.

* * * * *